(12) United States Patent
Bruce et al.

(10) Patent No.: US 7,257,247 B2
(45) Date of Patent: Aug. 14, 2007

(54) MASK DEFECT ANALYSIS SYSTEM

(75) Inventors: James A. Bruce, Williston, VT (US);
Orest Bula, Shelburne, VT (US);
Edward W. Conrad, Jeffersonville, VT (US); William C. Leipold, Enosburg Falls, VT (US); Michael S. Hibbs, Westford, VT (US); Joshua J. Krueger, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 665 days.

(21) Appl. No.: 09/683,836

(22) Filed: Feb. 21, 2002

(65) Prior Publication Data
US 2003/0161525 A1    Aug. 28, 2003

(51) Int. Cl.
*G06K 9/00* (2006.01)
(52) U.S. Cl. ............... 382/144; 382/141; 382/145; 382/149; 348/87; 348/125
(58) Field of Classification Search ......... 382/141, 382/144, 149, 145, 151; 348/87, 125, 126, 348/129, 130; 702/35, 81; 430/5, 30; 716/19, 716/21; 703/13
See application file for complete search history.

(56) References Cited

U.S. PATENT DOCUMENTS

| | | | |
|---|---|---|---|
| 5,544,256 A | 8/1996 | Brecher et al. | |
| 5,721,074 A | 2/1998 | Bae | |
| 5,777,901 A | 7/1998 | Berezin et al. | |
| 5,943,437 A | 8/1999 | Sumie et al. | |
| 5,965,306 A | 10/1999 | Mansfield et al. | |
| 5,978,501 A | 11/1999 | Badger et al. | |
| 5,999,003 A | 12/1999 | Steffan et al. | |
| 6,096,093 A | 8/2000 | Caywood et al. | |
| 6,169,960 B1 | 1/2001 | Ehrichs | |
| 6,205,239 B1 | 3/2001 | Lin et al. | |
| 6,272,236 B1 * | 8/2001 | Pierrat et al. | 382/144 |
| 6,366,687 B1 * | 4/2002 | Aloni et al. | 382/144 |
| 6,466,315 B1 * | 10/2002 | Karpol et al. | 356/237.4 |
| 6,691,052 B1 * | 2/2004 | Maurer | 702/81 |
| 6,757,645 B2 * | 6/2004 | Chang et al. | 703/13 |

(Continued)

FOREIGN PATENT DOCUMENTS

JP    58-223328    12/1983

(Continued)

*Primary Examiner*—Bhavesh M Mehta
*Assistant Examiner*—John Strege
(74) *Attorney, Agent, or Firm*—Richard M. Kotulak; Greenblum & Bernstein, P.L.C.

(57) ABSTRACT

An automated system for analyzing mask defects in a semiconductor manufacturing process is presented. This system combines results from an inspection tool and design layout data from a design data repository corresponding to each mask layer being inspected with a computer program and a predetermined rule set to determine when a defect on a given mask layer has occurred. Mask inspection results include the presence, location and type (clear or opaque) of defects. Ultimately, a determination is made as to whether to scrap, repair or accept a given mask based on whether the defect would be likely to cause product failure. Application of the defect inspection data to the design layout data for each mask layer being inspected prevents otherwise acceptable wafer masks from being scrapped when the identified defects are not in critical areas of the mask.

27 Claims, 5 Drawing Sheets

U.S. PATENT DOCUMENTS 6,850,320 B2 * 2/2005 Shibata et al. ........... 356/237.3
6,873,720 B2 * 3/2005 Cai et al. .................... 382/149

FOREIGN PATENT DOCUMENTS

| | | |
|---|---|---|
| JP | 59-61136 | 4/1984 |
| JP | 7-92094 | 4/1995 |
| JP | 8-137092 | 5/1996 |
| JP | 8-250405 | 9/1996 |
| JP | 2000-194864 | 7/2000 |

* cited by examiner

MASK DEFECT ANALYSIS SYSTEM

BACKGROUND OF THE INVENTION

1. Field of the Invention

The present invention generally relates to the field of semiconductor manufacturing, and, more particularly, to a method for automating the evaluation and analysis of defects in masks used in the semiconductor manufacturing process to determine which defects would cause product failure.

2. Background Description

As technology in the computer manufacturing field matures, the physical size of semiconductor chips continues to decrease dramatically. Accordingly, increasingly precise techniques and tools are required to manufacture the chips and the circuitry that is to be packaged on the chips. These techniques include the use of masks to create the circuit pattern corresponding to the chip design. It is a common practice in the industry to use masks in the manufacturing process for semiconductor chips. The design and layout of the circuit for the chip can be stored in the form of a mask, which can then be transferred to the surface of a silicon wafer. This process is referred to as photolithography. As the chips become smaller and smaller, the precision required in the masks increases. Therefore, the process for evaluation and inspection of the masks becomes increasingly important to the efficiency of the manufacturing operation.

Accepted techniques for inspection of masks use optical inspection tools to determine the presence of defects on the mask. The output of these tools can then be used in conjunction with pre-established criteria to determine if the defects require the masks to be scrapped, repaired or accepted. The most commonly used criterion is based on the size of the defect; however, defects can also be classified as to location and type (clear or opaque). In any event, the standard inspection process will tend to result in the rejection of masks when the size of the defect exceeds some maximum pre-established criterion. This approach is non-discriminating, however, because it is well known that not all defects in a given mask will necessarily lead to failure of the chip. For example, shorts between dummy fill shapes are generally harmless unless they merge to create a single shape larger than several microns. Also, via to via shorts between vias on the same net are harmless if they do not also cause the vias to expand outward beyond the underlying and overlying metal shapes. Accordingly, the standard approach can lead to the rejection of masks with defects in non-critical regions of the chip layout.

Based on this standard approach, otherwise acceptable masks would be scrapped unnecessarily. Alternatively, such masks must be analyzed manually by a human operator or a defect classification tool. Manual classification of defects, via an optical device or scanning electron microscope, can resolve issues such as whether a particular defect falls on or near dummy fill shapes rather than active circuit elements. However, in general, such techniques cannot resolve issues involving nets because simple inspection of the mask or the layout data does not suffice to accurately define the nets. In any event, either option is labor intensive and expensive and can be detrimental to the manufacturing process.

To improve the manufacturing process it is desirable to have an automated system for analyzing and evaluating the results from the inspection of the masks. An automated system would eliminate unnecessary scrapping of otherwise acceptable masks and would reduce the possibility of human error. Such a system will enhance both the pre-shipment inspection and repair process as well as the pre-acceptance inspection process. By identifying only those mask defects that will lead to chip failure, thereby ignoring the remainder of defects, the efficiency of the inspection/repair and acceptance process will be improved. Moreover, an automated system will allow manufacturers to concentrate on systemic errors that lead to defects in the masks, thereby improving the overall manufacturing process.

SUMMARY OF THE INVENTION

The present invention is directed to a system for analyzing mask defects in a semiconductor manufacturing process, and, more particularly, to a method for automating the evaluation and analysis of defects in the masks to determine which defects would cause product failure.

In one aspect of the present invention, masks used in the manufacturing of semiconductor wafers undergo a standard inspection process designed to locate the presence of defects on the mask. Any one of several commercially available mask inspection tools can be used, such as an optical device. Defect inspection data from that inspection process, which include the coordinates, sizes and types (clear or opaque) of defects, are recorded into a computer. Design data corresponding to an ideal mask (i.e., without defects) are stored in a design data repository, which is accessed for each layer of mask being inspected. In a preferred embodiment, the design data repository is a computer database program and suitable hard disk or other storage sufficient to store multiple large (i.e., over 1 GB) computer files that contain the design layout data. This design layout data is addressable not only by design level, with multiple design levels combining to make up a given layer of the mask, but also by chip part number or other suitable identifier. That design data is modified according to the defect inspection data, and the modified design data is analyzed with a computer program in conjunction with a rule set to determine if a given mask defect is likely to cause product failure. For each mask layer being analyzed, the computer program reads the output from the inspection report and then identifies defects as being present on the mask according to any shapes that do not exist in the design layout data. The computer program then generates shapes corresponding to these defects. A rule set exists for each mask layer being analyzed. The rule set includes criteria for analyzing both intra- and inter-level wafer problems associated with the location, size and type (clear or opaque) of mask defects. Finally, an industry standard design rule checking program is used to apply the rule set to determine whether to scrap, repair or accept the mask based on the current defect. When all defects have been analyzed or a scrap threshold has been reached, a decision is made as to whether any of the defects are likely to cause product failure.

In another aspect of the present invention, the inspection defect data comprises intensity contour plots from a commercially available inspection tool, such as AIMS. The intensity contour plots (also known as aerial images) contain the size, location and type of defect information similar to that provided by an optical inspection tool. In addition, the intensity contour plots provide information on how or if the defect will be resolved on the wafer when the mask image is transferred to the wafer. In this aspect of the present invention, the method for modifying the design data from the design data repository includes creating a simulated wafer image of the defect and merging the simulated wafer image into a simulated wafer image of a semiconductor chip. Thereafter, using the same analysis as that described for the first aspect of the present invention, the rule set is applied to analyze the simulated wafer image except that the rule set is modified to account for the mask magnification factor. This modification is used to scale the defect size and coordinates when the representative defect shape is generated in the layout data such that the rule set is written to be independent of the magnification factor.

In another aspect of the present invention, the method can be applied to both the inspection and the pre-acceptance process. During either process, masks that have defects can be accepted, rather than repaired, if the defects are within acceptable deviations from the design tolerances. This allows the repair process to be skipped altogether if it is determined that the defects so identified will not cause product failure (e.g., defects in non-critical areas of the mask, or defects are within acceptable tolerances). By eliminating unnecessary repairs, the cost and time of repair are saved. Furthermore, this can prevent the defects that are sometimes generated (or exacerbated) by the repair process itself.

In another aspect of the present invention, the system uses a set of heuristic rules for determining whether a given mask defect will be resolved on the wafer by the photolithographic process. Alternatively, that determination can be made using one of a variety of commercially available tools such as NumeriTech's Virtual Stepper â„¢ or the output of the AIMS tool. Heuristic rules for whether or not a defect would be resolved on the wafer would include defect size limits and limits on the defect placement relative to shapes from the design layout data. These rules are developed by empirical data on printed defects as well as photolithographically modeled results. Output from commercially available software (NumeriTech's Virtual Stepper â„¢ or the aerial image data from the AIMS tool) provides a more reliable method of determining whether or not a defect would be resolved on the wafer by modeling the photolithographic pattern transfer process. Ultimately, those mask defects which are resolved on the wafer would then be analyzed to determine if they were problematic.

In another aspect of the present invention, a mask is inspected for defects in order to evaluate the effect of defects. Defect locations are analyzed to classify the defects into critical defects and non-critical defects. The final disposition of the mask is determined by applying different acceptance rules to the critical defects and the non-critical defects. A standard acceptance rule is applied to the defects located in the critical portions of the mask while a loose acceptance rule is applied to the defects located outside of the critical portions. When the loose acceptance rule is applied, the non-critical defects are considered as the candidates for a looser mask acceptance criteria. The critical dimension measurement is selectively performed only to the critical defects and routed to a repair step 240 or a scrapping step 250. Thus, according to the present invention, the time consuming critical dimension measurements are performed restrictedly to the critical portions, thereby speeding up the measurement process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS

The present invention is directed to a system for analyzing defects in masks used in a semiconductor manufacturing process, and, more particularly, to a method for automating the evaluation and analysis of defects in the masks so as to determine if a given mask should be scrapped, repaired or accepted. The method utilizes defects identified through an industry-accepted inspection process and a design data repository that stores design layout data for each mask being inspected, combined with a predetermined rule set, to identify defects in the masks that would be likely to cause chip failures. By using the method of the present invention, an automated process is provided to determine whether mask defects identified during the inspection process will likely lead to failure of the product.

This method is not directed to determining whether a failure on the mask has occurred. Rather, the present invention relies on the pre-existing mask inspection process, as well as the pre-determined defect criteria, to determine if a defect (but not necessarily a failure) has occurred. Information regarding the defects includes the presence, location and type (clear or opaque) of defects that may have occurred. In turn, the method of the present invention uses that information from the inspection report to identify those masks that will likely cause chip failure and which, if they cannot be repaired, should be scrapped.

Figure 1:
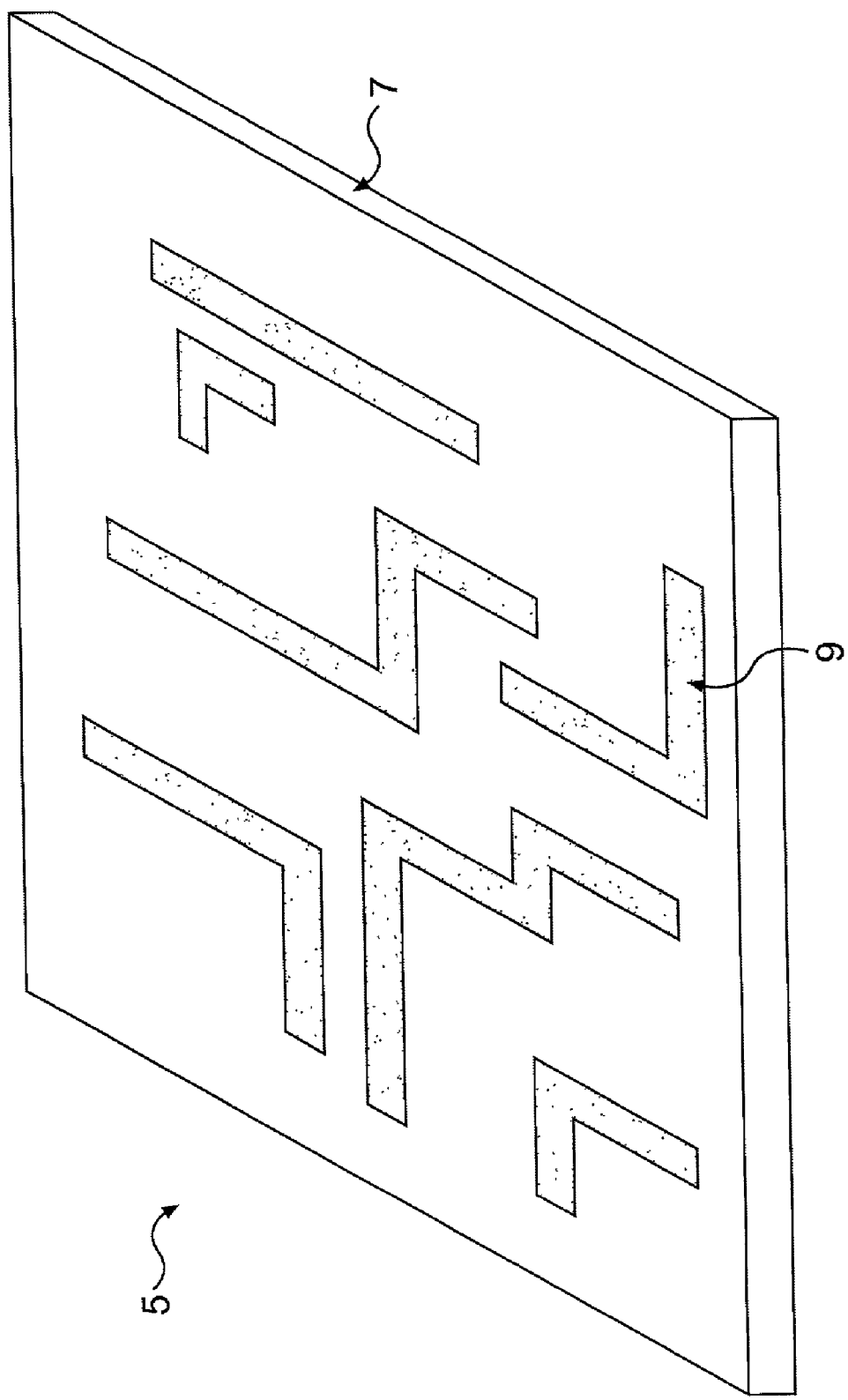
FIG. 1 depicts a mask used in the photolithography process of forming semiconductor wafers.

Referring now to the drawings, the system of the present invention will be described. FIG. 1 depicts schematically a mask 5 that is used in a semiconductor manufacturing process. The mask includes a clear (i.e., non-opaque) quartz substrate material 7, upon which resides an opaque chromium material 9 laid out in the circuit pattern designed for the semiconductor chip (not shown). The mask manufacturing process is known to be imperfect and can result in defects in the masks. For example, excess chromium material deposits 9 on the quartz substrate 7 (i.e., additional metal deposits in between the layout of the circuit pattern) can ultimately cause shorts in the semiconductor chip. As such, the mask 5 undergoes an inspection process to identify those defects. Unfortunately, the interpretation and use of the results from the inspection process using conventional techniques are labor intensive. Moreover, some defects on the mask are not critical and will not necessitate repairing or scrapping the mask. Therefore, a discriminatory inspection and evaluation system is required. The present invention provides a capability to use results from that inspection process to automate the decision making for determining whether a given mask should be scrapped, repaired or accepted.

Figure 2:
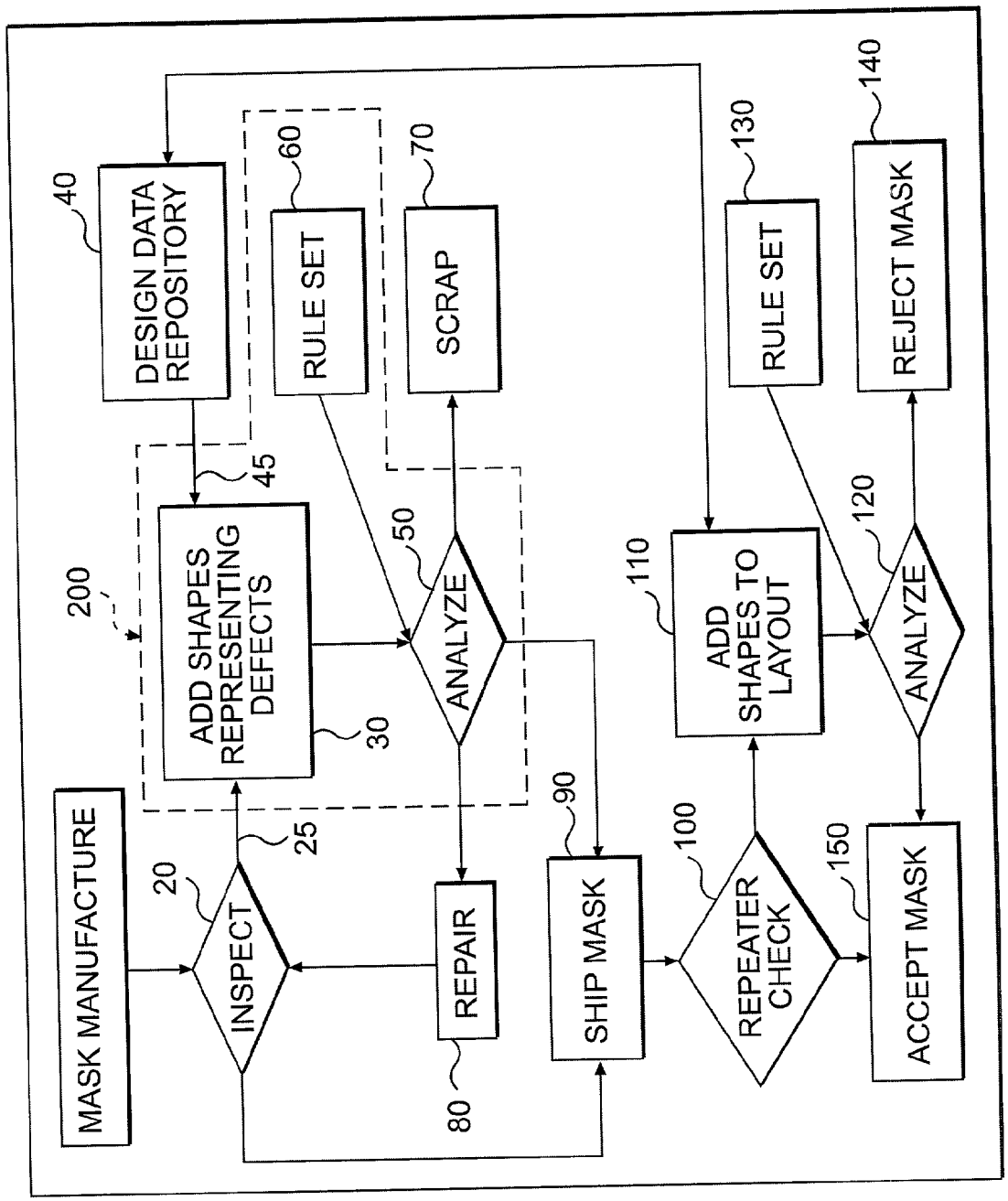
FIG. 2 contains a block diagram for a mask defect analysis system applied to both an inspection and a pre-acceptance process.

In a preferred embodiment, by way of example only, FIG. 2 depicts a block diagram of the mask defect analysis system 1 of the present invention. First, known and accepted industry techniques are used to manufacture 10 a mask. Next, the mask is inspected 20 using a known inspection tool, such as an optical inspection device (not shown). Note that is it possible to practice the present invention in such a way that the classification of the type of defect (whether clear or opaque) is performed manually by a human operator or by a defect classification tool. Results from the inspection are provided in a mask inspection report 25 (also depicted in FIG. 4). These results can be in tabular form and include the location, size and type (clear or opaque) of any defects identified as being present on the mask. Of course, the inspection report data can also be graphical in the form of intensity contour plots. In another aspect of the present invention, the inspection defect data comprises intensity contour plots from a commercially available inspection tool, such as AIMS. The intensity contour plots (also known as aerial images) contain the size, location and type of defect information similar to that provided by an optical inspection tool. In addition, the intensity contour plots provide information on how or if the defect will be resolved on the wafer when the mask image is transferred to the wafer.

Figure 4:
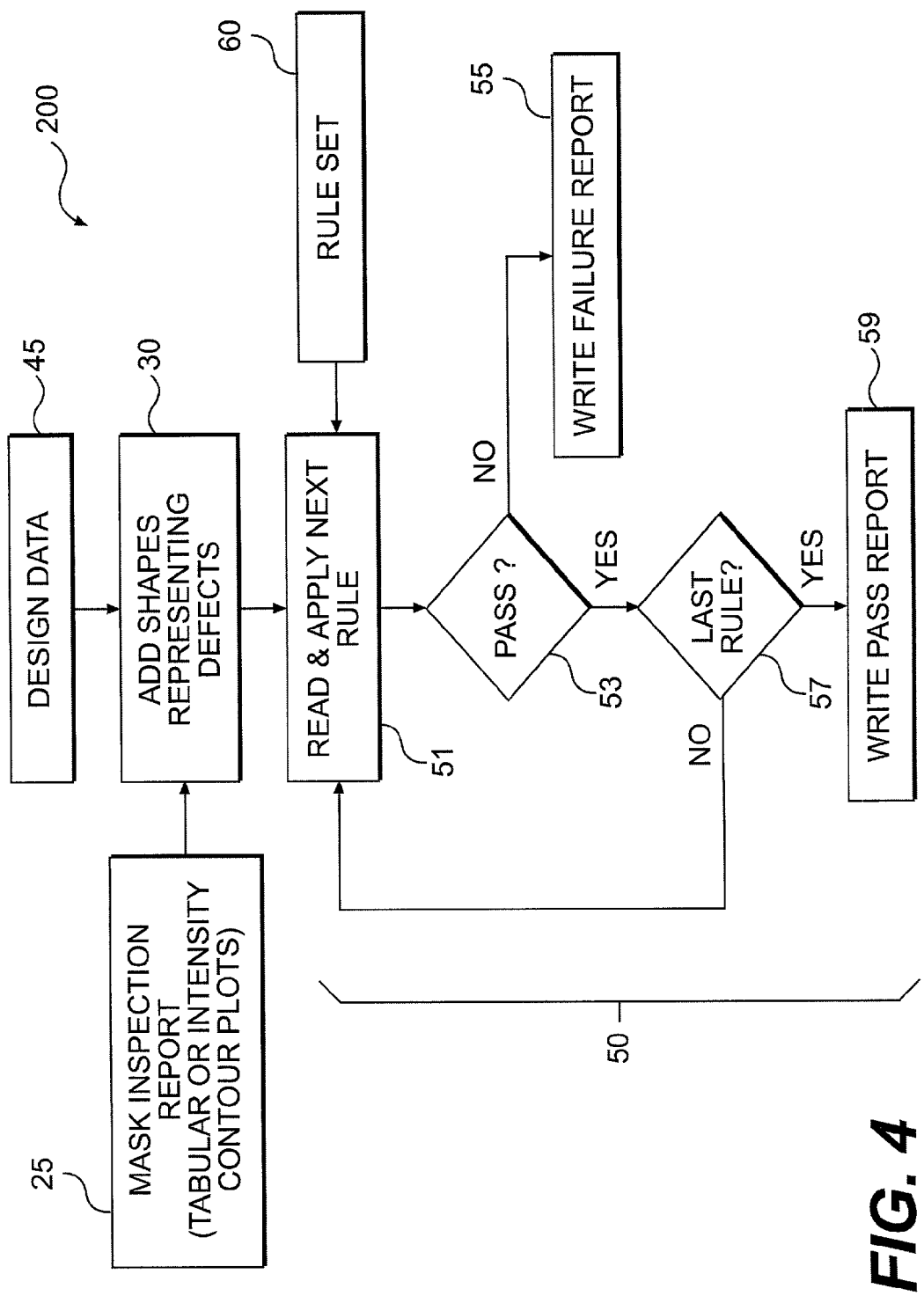
FIG. 4 is a flow chart of a computer program for analyzing defect inspection data.

Data from the mask inspection report 25 are then stored in a form readable by a computer program 200 (also discussed below along with FIG. 4).

The following depicts exemplary results from the mask inspection report 25 that are stored in tabular form.

inspection tool and is descriptive of the characteristics of a given defect. Defect size types are grouped into "buckets" and labeled as A, B, C, etc. Severity of defects are automatically classified as "pass" or "fail" by the inspection tool based on the defect type and size type ($5^{th}$ and $6^{th}$ columns). The size of each defect is also recorded ($7^{th}$ and $8^{th}$ columns). Finally, a designation of user type or defect type is included ($9^{th}$ column) in which the defect type is determined by a manual microscope review by a human operator and is based on user-specified criteria such as "opaque defect on a line edge" or "isolated clear defect."

Continuing with FIG. 2, the system generates and adds shapes representing defects 30 corresponding to the results from the inspection defect data. Also, design data 45 (also depicted in FIG. 4) corresponding to the mask level being inspected are retrieved from a design data repository 40, which is essentially a computer database program for storage of large data files. An analysis 50 is performed using the generated shapes 30 and design data 45 in conjunction with a predetermined rule set 60. This analysis step is discussed in more detail in conjunction with FIG. 4. The outcome of the analysis step 50 is to determine if the defect is critical, that is whether the mask should be scrapped 70, repaired 80 or accepted for shipping 90. By applying the above-described system to each defect identified by the inspection tool, an automated system for examining and analyzing

| Defect No. | Ref X loc. (mm) | Ref Y loc. (mm) | Auto Type | Size Type | Svrty | X Size (um) | Y Size (um) | User Type |
| --- | --- | --- | --- | --- | --- | --- | --- | --- |
| 2 | 83.6116 | −101.2827 | Dim Chrome | A | Pass | 0.500 | 0.500 | 3C |
| 3 | 40.5808 | −98.9018 | Dim Chrome | A | Pass | 0.500 | 0.500 | 2C |
| 4 | 40.5784 | −98.8708 | Contam On Chrome | D | Fail | 5.000 | 3.000 | 3C |
| 5 | 89.9094 | −95.4073 | Dim Chrome | A | Pass | 0.500 | 0.500 | 3C |
| 6 | 63.5390 | −93.8937 | Contam On Edge | A | Fail | 0.500 | 0.500 | 2A |
| 7 | 82.2504 | −93.4359 | Dim Chrome | A | Pass | 0.500 | 1.000 | 3C |
| 8 | 76.8741 | −90.3492 | Dim Chrome | A | Pass | 0.500 | 1.000 | 3C |
| 9 | 79.8490 | −89.6193 | Dim Chrome | A | Pass | 0.500 | 0.500 | 3C |
| 10 | 30.9956 | −88.8151 | Dim Chrome | A | Pass | 1.000 | 1.000 | 3C |
| 11 | 39.9058 | −83.5845 | Dim Chrome | A | Pass | 1.000 | 1.000 | 3C |
| 12 | 40.2300 | −82.1064 | Contam On Chrome | C | Warn | 1.000 | 3.000 | 2C |
| 13 | 31.8315 | −80.8188 | Bright Chrome | B | Pass | 0.500 | 2.000 | 1A |
| 14 | 82.6267 | −78.7788 | Contam On Chrome | C | Warn | 3.000 | 3.000 | 2C |
| 15 | 82.4353 | −78.6923 | Contam On Chrome | A | Pass | 0.500 | 1.000 | 2C |
| 16 | 82.4026 | −78.5518 | Dim Chrome | A | Pass | 0.500 | 1.000 | 3C |
| 17 | 10.5894 | −72.4460 | Dim Chrome | A | Pass | 0.500 | 0.500 | 3C |
| 18 | 41.1788 | −71.2059 | Contam On Chrome | B | Pass | 1.000 | 1.500 | 3C |
| 19 | 44.1204 | −69.1854 | Dim Chrome | A | Pass | 0.500 | 1.000 | 3C |
| 20 | 34.9878 | −67.6938 | Dim Chrome | A | Pass | 1.000 | 0.500 | 3C |
| 21 | 12.2929 | −67.6118 | Dim Chrome | A | Pass | 1.000 | 0.500 | 3C |
| 22 | 44.9030 | −63.5399 | Dim Chrome | B | Pass | 1.000 | 1.500 | 3C |
| 23 | 22.5109 | −61.3091 | Contam On Chrome | A | Pass | 1.000 | 1.000 | 1A |
| 24 | 43.0525 | −60.5868 | Dim Chrome | A | Pass | 0.500 | 0.500 | 3C |
| 25 | 78.6846 | −59.5940 | Dim Chrome | B | Pass | 0.500 | 1.500 | 3C |
| 26 | 38.4842 | −59.1307 | Dim Chrome | A | Pass | 0.500 | 0.500 | 3C |
| 27 | 29.8313 | −57.3956 | Contam On Edge | A | Fail | 0.500 | 0.500 | 4C |
| 28 | 29.8172 | −57.3746 | Contam On Edge | A | Fail | 0.500 | 0.500 | 4C |
| 29 | 78.9023 | −57.0952 | Dim Chrome | A | Pass | 1.000 | 0.500 | 3C |
| 30 | 43.3913 | −56.8387 | Dim Chrome | A | Pass | 0.500 | 1.000 | 3C |
| 31 | 75.9490 | −55.9790 | Dim Chrome | A | Pass | 1.000 | 1.000 | 3C |
| 32 | 100.8808 | −52.9098 | Dim Chrome | A | Pass | 0.500 | 0.500 | 3C |

As shown in the table, each defect is numbered ($1^{st}$ column) and its planar location is recorded ($2^{nd}$ and $3^{rd}$ columns). The planar location is determined with respect to an arbitrary position on the mask as chosen by the human operator when the mask is loaded into the inspection tool. Each defect is also categorized as to defect type ($4^{th}$ column), size type ($5^{th}$ column) and severity of defect ($6^{th}$ column). The defect type is determined automatically by the defects in the mask is created and can ultimately allow a determination of which defects will cause product failure.

Figure 3B:
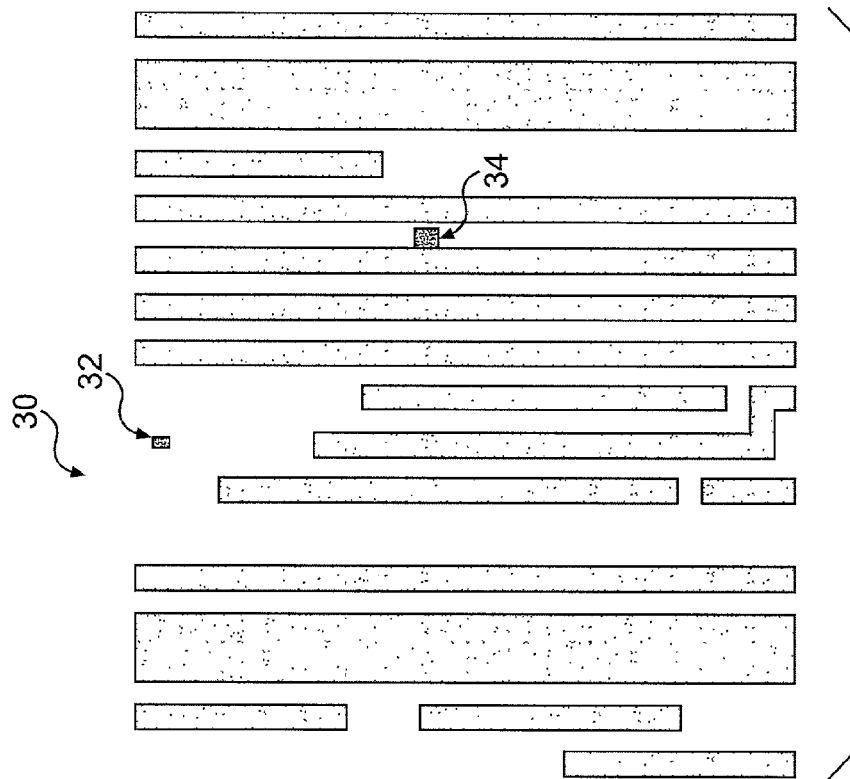
FIG. 3b depicts shapes generated by a computer program corresponding to defects in the design layout data.
Figure 3A:
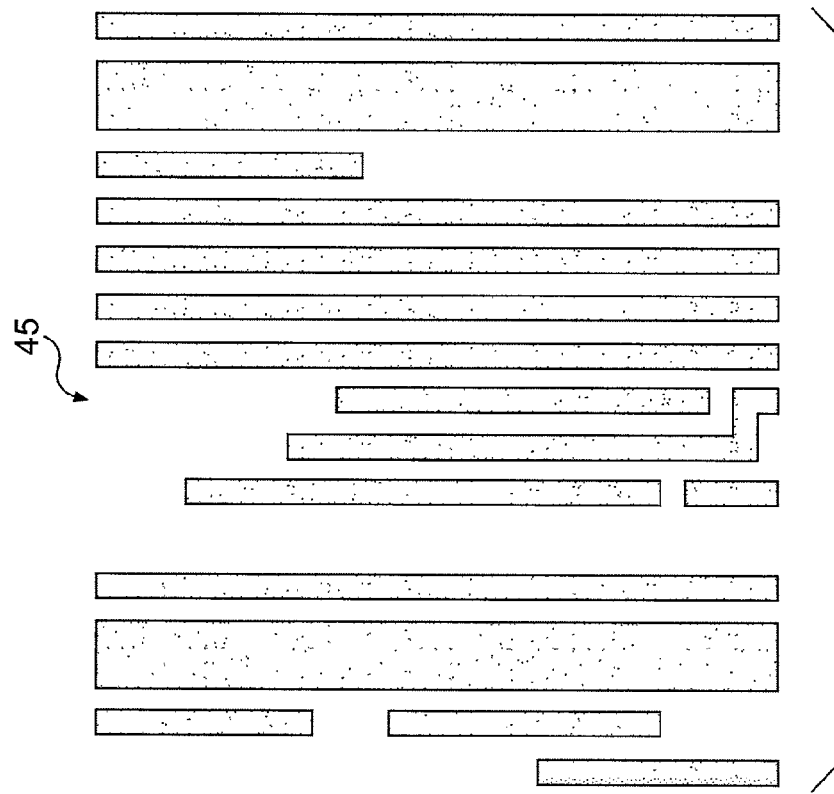
FIG. 3a depicts design layout data retrieved from a data repository for each mask layer being inspected.

To better illustrate the need for the analysis step, FIGS. 3a and 3b depict the effect of a defect on a mask. FIG. 3a exemplifies the design layout data 45 for a given mask as retrieved from the design data repository 40. This represents the ideal mask layout (i.e., without defects). By comparison, FIG. 3b depicts shapes 30 generated by the computer program 200 based on the results from the inspection process. A defect is considered to be present on the mask whenever a generated shape 30 is not found in the design layout data 45. However, not all defects are considered harmful to the mask, and certain defects can be ignored if located in unimportant areas of the mask. To illustrate this, in FIG. 3b it can be seen there is one harmless defect 32 and one fatal defect 34. The defect 32 is considered harmless because it is located in a non-critical area of the mask. However, the fatal defect 34 is so designated because it is in a critical location of the mask and is likely to cause a short between the two adjoining chromium strips. In FIG. 4 the computer program 200 is depicted in block diagram form. As a first step, the program receives input data (e.g., tabular or intensity contour plots) from the mask inspection report 25, which includes the size, location and type (clear or opaque) of any defects located on the mask. Next, the program loads the design layout data 45 such as that depicted in FIG. 3a. Representative shapes 30, such as those depicted in FIG. 3b, are then generated by the program for each design level corresponding to the mask being analyzed. At this point, the analysis step 50 from FIG. 2 can be performed using a predetermined rule set 60. This analysis step 50 is expanded in FIG. 4 and includes elements 51 through 59. For instance, the program reads a rule 51 from the rule set 60 that applies to the given mask. Then, using an industry standard design rule checking program, each rule of the rule set 60 is applied 51 to the representative defect shapes 30 to determine whether to repair, accept or scrap the mask based on the current defect. The outcome 53 of a given rule is a designation of "pass" or "fail." If the defect is a "pass," the next rule is read and applied 51 until the last rule is reached 57 and a pass report is generated 59. However, if the defect is a "fail," a failure report 55 is generated. In that event, the mask can either be sent for repair (step 80 from FIG. 2) or scrapped (step 70 from FIG. 2). This analysis is continued and the results of this analysis are tabulated (not shown) until all defects have been analyzed and/or until a predetermined scrap threshold has been reached. As described above, in conjunction with FIG. 2, the results of this analysis ultimately are used to determine if a given mask should be scrapped 70, repaired 80 or accepted for shipment 90.

An exemplary rule set 60 is shown below, in which the following definitions are used:

MINLINE—design rule minimum feature size on the level in question;

MAXLINE—design rule maximum feature size on the level in question;

MINSPACE—design rule minimum space between shapes on levels in question;

VARSPACE—design rule minimum space on the level in question when the space is dependent on the size of the feature;

MASKINSPECT ã€"mask magnification * minimum mask feature inspection limit;

OPPOSITE—shape on complement implant mask; and

BLOB—mask defect (clear or opaque).

DT level

BLOB width <= MAXLINE on both axes (trench fill)
BLOB width >= MINLINE (eliminate possible PLY problems)
BLOB to DT >= MINSPACE
BLOB to adjacent DTFILL >= MINSPACE (resist adhesion)

-continued

BLOB to RX >= MINSPACE
BLOB to PC >= MINSPACE
BLOB to MC >= MINSPACE
BLOB to CA >= MINSPACE
BLOB to BLOB >= MINSPACE
RX level BLOB width >= MINLINE
BLOB to DT >= MINSPACE
BLOB to RX >= MINSPACE
BLOB to adjacent RXFILL >= MINSPACE
BLOB to PC >= MINSPACE
BLOB to MC >= MINSPACE
BLOB to ESDUMMY >= MINSPACE
BLOB to CA >= MINSPACE
BLOB to BLOB >= MINSPACE
PC level BLOB width >= MINLINE (resist adhesion)
BLOB to DT >= MINSPACE
BLOB to RX >= MINSPACE
BLOB to PC >= MINSPACE
BLOB to adjacent PCFILL >= MINSPACE
BLOB to MC >= MINSPACE
BLOB to CA >= MINSPACE
BLOB to BLOB >= MINSPACE
MC level BLOB width >= MINLINE
BLOB to DT >= MINSPACE
BLOB to RX >= MINSPACE
BLOB to PC >= MINSPACE
BLOB to MC >= MINSPACE
BLOB to CA >= MINSPACE
BLOB to BLOB >= MINSPACE
CA level BLOB width >= MINLINE
BLOB to DT >= MINSPACE
BLOB to RX >= MINSPACE
BLOB to PC >= MINSPACE
BLOB to MC >= MINSPACE
BLOB to CA >= MINSPACE
BLOB to M1 >= MINSPACE
BLOB to BLOB >= MINSPACE
BLOB to CA (same net when BLOB is an extension) >= MASKINSPECT
M1 level BLOB width >= MINLINE
BLOB width <= MAXLINE (Cu technologies)
BLOB to MC >= MINSPACE
BLOB to CA >= MINSPACE
BLOB to M1 >= VARSPACE
BLOB to adjacent M1FILL >= VARSPACE
BLOB to V1 >= MINSPACE
BLOB to BLOB >= MINSPACE
V1 level BLOB width >= MINLINE
BLOB width <= MAXLINE (via fill)
BLOB to CA >= MINSPACE
BLOB to M1 >= MINSPACE
BLOB to V1 >= MINSPACE
BLOB to M2 >= MINSPACE
BLOB to BLOB >= MINSPACE
BLOB to V1 (same net when BLOB is an extension) >= MASKINSPECT
Mx level BLOB width >= MINLINE
BLOB width <= MAXLINE (Cu technologies)
BLOB to Vx-1 >= MINSPACE
BLOB to Mx >= VARSPACE
BLOB to adjacent Mx >= VARSPACE
BLOB to Vx >= MINSPACE
BLOB to BLOB >= MINSPACE
Vx level BLOB width >= MINLINE
BLOB width <= MAXLINE (via fill)

```
-continued

BLOB to Mx >= MINSPACE
BLOB to Vx-1 >= MINSPACE
BLOB to Vx >= MINSPACE
BLOB to Vx+1 >= MINSPACE
BLOB to Mx+1 >= MINSPACE
BLOB to BLOB >= MINSPACE
BLOB to Vx (same net when BLOB is an extension) >= MASKINSPECT
Implant level (XX)

BLOB width >= MINLINE
BLOB to OPPOSITE >= MINSPACE
BLOB to adjacent RX >= MINSPACE
BLOB to adjacent XX >= MINSPACE
BLOB to BLOB >= MINSPACE
```

In the above rule set 60, the identifiers DT, RX, PC, MC, CA, M1, V1, Mx, Vx, and XX refer to design levels that, in turn, make up the mask layers and to which a representative defect shape 30 may be added. These rules essentially specify the acceptable distances, widths, etc. for the defect itself and its relationship to shapes on the same or other design levels.

In an additional embodiment of the present invention, as depicted in the bottom portion of FIG. 2, the inspection and analysis process can be repeated for each mask that passes beyond the inspection process, that is, each mask that has been cleared for shipment 90 or has not been otherwise scrapped 70. An additional inspection is performed 100 on any mask layer ready to be shipped 90, and the results of that inspection are similar to those described above. Design layout data 45 for each mask layer being inspected are again retrieved from the design data repository 40. Thereafter, the computer program 200 generates shapes 110 corresponding to the defect layout data 45 from the inspection tool 100. Then another analysis 120 is performed to determine if the mask 5 should ultimately be rejected 140 or accepted 150.

Figure 5:
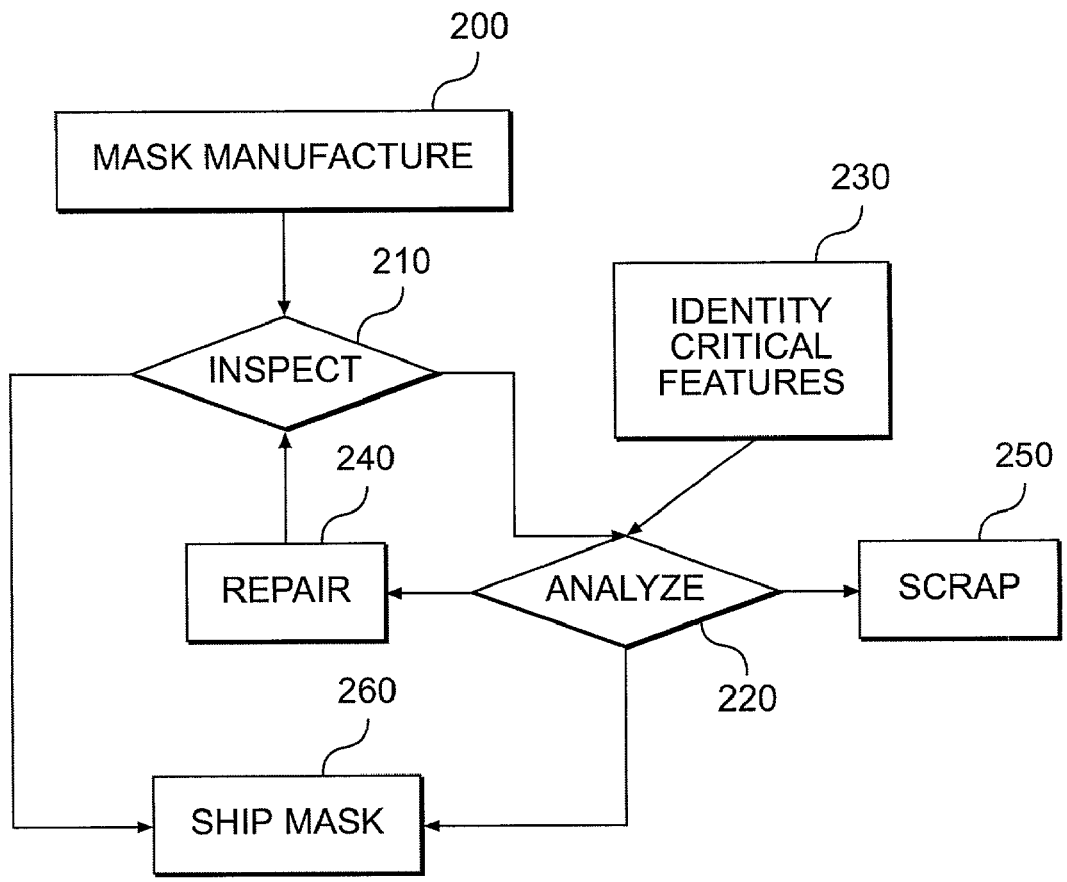
FIG. 5 is a process flow chart for determining a final disposition of a component by applying different acceptance rules depending on defect criticality.

In another preferred embodiment, by way of example only, FIG. 5 depicts a block diagram for a component defect analysis system, in which different acceptance rules are applied to the defects depending on the criticality.

Conventional mask acceptance criteria allow certain defects located in non-critical portion of a mask to be ignored when determining the disposition of a mask. This means, for example, the mask acceptance criteria for a polysilicon level mask can be manipulated to ignore defects located in certain portions. However, polysilicon wires are not distinguishable from polysilicon gates. Thus, when the mask acceptance criteria for gates are applied to wires during the mask inspection, this may cause the mask to fail certain criteria (e.g., critical dimension control) which are only critical to the gate but not to the wires. This may unnecessarily initiate a critical dimension measurement process which is time consuming, thereby increasing inspection time.

To solve this problem, in FIG. 5, there is shown a process flow chart for determining a final disposition of a component (e.g., mask) by applying different acceptance rules depending on defect criticality. The defects could be opaque, clear or phase variations.

A mask (e.g., mask for polysilicon layer) is designed and produced during a step 200. Simultaneously with the step 200 or independently during a step 230, the mask design data is analyzed preferably by a computer system, to determine critical portions and non-critical portions for corresponding mask acceptance criteria. For example, the mask design data is analyzed to distinguish gates from wires on the polysilicon level, and, as the analysis result, the wires are determined to be the non-critical portions while the gates are determined to be the critical portions. The analysis result is stored to a file, preferably a computer readable data file, which includes locations and sizes of gates.

Subsequently, the mask is inspected for defects by using an inspection tool during an inspect step 210. If no defect is located, the masked is routed to a shipping step 260. If defects are located, another file is created from the inspection step, which stores the locations and sizes of defects identified by the inspection tool. In a step 220, the two files are analyzed together to determine if defects are located in the critical portions or the non-critical portions of the mask.

Based on the analysis, the defects are sorted into several classifications. For example, the defects located in the critical portions are classified as critical defects and the defects located outside of the critical portions are classified as non-critical defects. Different acceptance rules are applied to the defects depending on the defect classification, and the final disposition of the mask is determined based on the mask's defect classifications. A standard acceptance rule is applied to the defects located in the critical portions of the mask while a loose acceptance rule is applied to the defects located outside of the critical portions. When the loose acceptance rule is applied, the non-critical defects are considered as the candidates for a looser mask acceptance criteria. For example, as long as the minimum design rules are not violated, a mask having a polysilicon wire having width or transmissivity larger than that of the standard polysilicon gate can be accepted and shipped as shown in a step 260. The critical dimension measurement is selectively performed only to the critical defects and routed to a repair step 240 or a scrapping step 250. The repaired masks are routed to the inspection step 210 to repeat the entire mask disposition process.

The spatial component of the looser acceptance rules could be defined as a set of rules used to identify regions of the layout which in turn could be used when re-inspecting the repaired mask. This procedure results in fewer scrapped masks due to repair failures. Also, the entire processing steps can be implemented into a computer software program which can control the mask inspection tool.

Thus, according to the present invention, features in the layout could be sorted into critical or non-critical portions. Time consuming critical dimension measurements are performed restrictedly to the critical portions, thereby speeding up the measurement process. Feedback from this mask disposition process could also be incorporated for macros which can be used on other masks.

While the invention has been described in terms of preferred embodiments, and specific embodiments by way of example in the drawings are described in detail, it should be understood that the drawings and detailed description thereto are not intended to limit the invention to the particular form disclosed. To the contrary, those skilled in the art will recognize that the present invention can be practiced with modifications, equivalents and alternatives within the spirit and scope of the appended claims.

Having thus described our invention, what we claim as new and desire to secure by Letters Patent is as follows:

1. A method of evaluating the effect of defects on components in a semiconductor manufacturing process, said method comprising the steps of:
   inspecting a component for defects using an inspection tool;
   recording defect inspection data from the inspection tool;

accessing design data from a design data repository corresponding to the component being inspected;

modifying said design data for the component according to said defect inspection data;

analyzing said modified design data;

classifying the defects into critical defects and the non-critical defects based on the analyzing; and determining a final disposition of the component by applying different acceptance rules to the critical defects and the non-critical defects.

2. The method of claim 1, wherein the components being inspected comprise masks for semiconductor wafers and the components are combined to generate a mask layer.

3. The method of claim 1, wherein the inspection tool is an optical inspection device and said defect inspection data include defect location, defect size and a designation of defect type as clear or opaque.

4. The method of claim 2, wherein said final disposition of the mask being inspected includes one of: scrapping the mask, repairing the mask, and accepting the mask.

5. The method of claim 2, wherein said determining includes a determination as to whether a defect would be likely to cause product failure.

6. The method of claim 3, wherein said designation of defect type as clear or opaque is performed by one of manually by an operator and a defect classification tool.

7. The method of claim 3, wherein said defect inspection data comprise intensity contour plots, and the method for modifying said design data includes the following steps:

creating a simulated wafer image of the defect; and merging said simulated wafer image into a simulated wafer image of a semiconductor chip.

8. The method of claim 1, wherein said design data repository comprises a database suitable for storage of large data files, and wherein said database includes design data for each component being inspected.

9. The method of claim 2, wherein the method for modifying said design data comprises the step of generating a representative defect shape for each mask layer being inspected corresponding to defects from said defect inspection data.

10. The method of claim 2, wherein said analyzing comprises analyzing both intra-level and inter-level problems of the mask layer corresponding to said inspection defect data.

11. A method of evaluating the effect of defects on masks for semiconductor wafers, said method comprising the steps of:

inspecting a mask for defects using an inspection tool;

recording defect inspection data from the inspection tool;

accessing design data from a design data repository corresponding to a level of a mask layer being inspected;

modifying said design data for said level of a mask layer according to said defect inspection data;

analyzing said modified design data;

classifying the defects into critical defects and non-critical defects based on the analyzing; and determining a final disposition of the mask by applying different acceptance rules to the critical defects and the non-critical defects.

12. The method of claim 11, wherein said final disposition of the mask includes one of: scrapping the mask, repairing the mask, and accepting the mask, and said previously established criteria includes a determination as to whether a defect would be likely to cause product failure.

13. The method of claim 12, said method further comprising the steps of:

repairing masks in which defects identified from the inspection tool are within acceptable limits; and scrapping masks in which defects identified from the inspection tool are outside acceptable limits.

14. The method of claim 11, further comprising the step of determining if a defect identified from the inspection tool will be resolved on a wafer by the photolithographic process.

15. The method of claim 14, wherein said method for determining if said defect will be resolved on the wafer is one of a set of heuristic rules and a commercially available tool or software program.

16. A system for evaluating the effect of defects in masks for semiconductor wafers during pre-shipment inspection and pre-acceptance inspection of masks for semiconductor wafers, said system comprising:

an inspection tool for inspecting a mask for defects;

a recording medium for storing said defect inspection data from the inspection tool;

a design data repository containing design level data for a level of a mask layer being inspected;

a computer program for modifying said design data for said level of mask layer according to said defect inspection data; and a rule set for analyzing said modified design data to determine a final disposition of the mask according to previously established criteria, wherein the final disposition of the mask is determined after the defects are classified into critical defects and non-critical defects and by applying different acceptance rules to the critical defects and the non-critical defects.

17. The system of claim 16, wherein said final disposition of the mask includes one of: scrapping the mask, repairing the mask, and accepting the mask, and said previously established criteria includes a determination as to whether a defect would be likely to cause product failure.

18. The system according to claim 17, wherein the inspection tool is an optical inspection device and defect inspection data include defect location, defect size and a designation of defect type as clear or opaque.

19. A computer readable medium comprising code for causing a computer to implement steps of a method for evaluating the effect of defects on masks in a semiconductor manufacturing process, said method comprising:

inspecting a mask for defects using an inspection tool;

recording defect inspection data from the inspection tool;

accessing design data from a design data repository corresponding to a level of a mask layer being inspected;

modifying said design data for said level of a mask layer according to said defect inspection data;

analyzing said modified design data;

classifying the defects into critical defects and non-critical defects based on the analyzing; and determining a final disposition of the mask by applying different acceptance rules to the critical defects and the non-critical defects.

20. The method of claim 19, wherein said final disposition of the mask includes one of: scrapping the mask, repairing the mask, and accepting the mask, and said previously established criteria includes a determination as to whether a defect would be likely to cause product failure.

21. A method of evaluating the effect of defects on components in a semiconductor manufacturing process, said method comprising:

inspecting a component for defects using an inspection tool;
storing defect inspection data from the inspection tool;
generating shapes representing the defects;
retrieving design data from a design data repository corresponding to the component being inspected; and
performing an analysis using the design data, the generated shapes, and a pre-determined rule set to determine whether the defects are critical defects and non-critical defects,
wherein a final disposition of the component is determined by applying different acceptance rules to the critical defects and the non-critical defects.

22. The method of claim 1, wherein the classifying the defects comprises:
determining critical portions and non-critical portions of the component; and
determining if the defects are in the critical portions or the non-critical portions.

23. The method of claim 1, wherein the applying different acceptance rules comprises:
applying a first acceptance rule to the defects located in critical portions of the component; and
applying a second acceptance rule, that is looser than the first acceptance rule, to the defects located outside the critical portions of the component.

24. The method of claim 11, wherein the classifying the defects comprises:
determining critical portions and non-critical portions of the mask; and
determining if the defects are in the critical portions or the non-critical portions.

25. The method of claim 11, wherein the applying different acceptance rules comprises:
applying a first acceptance rule to the defects located in critical portions of the mask; and
applying a second acceptance rule, that is looser than the first acceptance rule, to the defects located outside the critical portions of the mask.

26. The method of claim 16, wherein the classifying the defects comprises:
determining critical portions and non-critical portions of the mask; and
determining if the defects are in the critical portions or the non-critical portions.

27. The method of claim 16, wherein the applying different acceptance rules comprises:
applying a first acceptance rule to the defects located in critical portions of the mask; and
applying a second acceptance rule, that is looser than the first acceptance rule, to the defects located outside the critical portions of the mask.

* * * * *